US008573152B2

(12) United States Patent
de la Llera et al.

(10) Patent No.: US 8,573,152 B2
(45) Date of Patent: Nov. 5, 2013

(54) SHOWERHEAD ELECTRODE

(75) Inventors: Anthony de la Llera, Fremont, CA (US); Pratik Mankidy, Fremont, CA (US); Michael C. Kellogg, Oakland, CA (US); Rajinder Dhindsa, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 687 days.

(21) Appl. No.: 12/875,869

(22) Filed: Sep. 3, 2010

(65) Prior Publication Data

US 2012/0055632 A1 Mar. 8, 2012

(51) Int. Cl.

| | |
|---|---|
| ***C23C 16/455*** | (2006.01) |
| ***C23C 16/505*** | (2006.01) |
| ***C23C 16/509*** | (2006.01) |
| ***B23P 19/00*** | (2006.01) |
| ***C23F 1/00*** | (2006.01) |
| ***H01L 21/306*** | (2006.01) |
| *C23C 16/06* | (2006.01) |
| *C23C 16/22* | (2006.01) |

(52) U.S. Cl.
USPC .............. 118/723 E; 118/723 R; 156/345.43; 156/345.44; 156/345.45; 156/345.46; 156/345.47; 29/746

(58) Field of Classification Search
USPC .......... 118/723 R, 723 E; 156/345.43–345.47
See application file for complete search history.

(56) References Cited

U.S. PATENT DOCUMENTS

| | | | |
|---|---|---|---|
| 4,585,920 | A | 4/1986 | Hoog et al. |
| 4,612,077 | A | 9/1986 | Tracy et al. |
| 4,908,095 | A | 3/1990 | Kagatsume et al. |
| 5,074,456 | A | 12/1991 | Degner et al. |
| 5,200,016 | A | 4/1993 | Namose |
| 5,356,515 | A | 10/1994 | Tahara et al. |
| 5,423,936 | A | 6/1995 | Tomita et al. |
| D363,464 | S | 10/1995 | Fukasawa |
| 5,500,256 | A | 3/1996 | Watabe |
| 5,534,751 | A | 7/1996 | Lenz et al. |
| 5,569,356 | A | 10/1996 | Lenz et al. |
| 5,589,002 | A | 12/1996 | Su |
| 5,590,975 | A | 1/1997 | Horntvedt |
| 5,593,540 | A | 1/1997 | Tomita et al. |
| 5,624,498 | A | 4/1997 | Lee et al. |

(Continued)

FOREIGN PATENT DOCUMENTS

| | | | |
|---|---|---|---|
| JP | 56-087667 | A1 | 7/1981 |
| JP | 07-066180 | A | 3/1995 |

(Continued)

OTHER PUBLICATIONS

International Search Report and Written Opinion mailed Jun. 25, 2012 for PCT/US2011/001500.

(Continued)

*Primary Examiner* — Rudy Zervigon
(74) *Attorney, Agent, or Firm* — Buchanan Ingersoll & Rooney PC

(57) ABSTRACT

A showerhead electrode, a gasket set and an assembly thereof in plasma reaction chamber for etching semiconductor substrates are provided with improved a gas injection hole pattern, positioning accuracy and reduced warping, which leads to enhanced uniformity of plasma processing rate. A method of assembling the inner electrode and gasket set to a supporting member includes simultaneous engagement of cam locks.

17 Claims, 14 Drawing Sheets

(56) References Cited

U.S. PATENT DOCUMENTS 5,740,009 A 4/1998 Pu et al.
5,746,875 A 5/1998 Maydan et al.
5,766,364 A 6/1998 Ishida et al.
5,792,269 A 8/1998 Deacon et al.
5,882,411 A * 3/1999 Zhao et al. .................... 118/715
D411,516 S 6/1999 Imafuku et al.
D412,513 S 8/1999 Ooyabu
5,959,409 A 9/1999 Dornfest et al.
5,993,597 A 11/1999 Saito et al.
5,997,649 A 12/1999 Hillman
D420,022 S 2/2000 Burkhart et al.
6,024,799 A 2/2000 Chen et al.
6,036,782 A 3/2000 Tanaka et al.
6,039,836 A 3/2000 Dhindsa et al.
6,050,216 A 4/2000 Szapucki et al.
6,050,506 A 4/2000 Guo et al.
D425,919 S 5/2000 Burkhart et al.
6,079,356 A * 6/2000 Umotoy et al. ........... 118/723 E
6,086,677 A * 7/2000 Umotoy et al. ............... 118/715
6,086,710 A 7/2000 Miyashita et al.
6,110,287 A 8/2000 Arai et al.
6,110,556 A 8/2000 Bang et al.
6,132,512 A 10/2000 Horie et al.
6,170,432 B1 1/2001 Szapucki et al.
6,173,673 B1 1/2001 Golovato et al.
6,200,415 B1 3/2001 Maraschin
6,206,972 B1 3/2001 Dunham
D441,348 S 5/2001 Todd et al.
6,228,208 B1 5/2001 Lill et al.
6,237,528 B1 5/2001 Szapucki et al.
6,302,964 B1 * 10/2001 Umotoy et al. ............... 118/715
6,368,450 B2 4/2002 Hayashi
6,389,677 B1 5/2002 Lenz
6,391,787 B1 5/2002 Dhindsa et al.
6,432,261 B2 8/2002 Watanabe et al.
6,444,037 B1 9/2002 Frankel et al.
6,461,435 B1 10/2002 Littau et al.
6,477,980 B1 11/2002 White et al.
6,495,233 B1 12/2002 Shmurun et al.
6,506,686 B2 1/2003 Masuda et al.
6,550,126 B1 4/2003 Szettella et al.
6,553,932 B2 4/2003 Liu et al.
6,558,506 B1 5/2003 Freeman et al.
6,586,886 B1 7/2003 Katz et al.
6,653,734 B2 11/2003 Flanner et al.
6,723,202 B2 4/2004 Nagaiwa et al.
D490,450 S 5/2004 Hayashi et al.
6,753,498 B2 6/2004 Sirkis et al.
D493,873 S 8/2004 Hayashi
6,786,175 B2 9/2004 Dhindsa et al.
6,818,096 B2 11/2004 Barnes et al.
6,827,815 B2 12/2004 Hytros et al.
6,872,258 B2 3/2005 Park et al.
6,899,786 B2 5/2005 Senzaki et al.
6,936,135 B2 8/2005 Antolik
6,942,753 B2 9/2005 Choi et al.
7,083,702 B2 8/2006 Blonigan et al.
7,159,537 B2 1/2007 Wickramanayaka et al.
7,166,200 B2 1/2007 Saigusa et al.
7,196,283 B2 3/2007 Buchberger, Jr. et al.
7,270,713 B2 9/2007 Blonigan et al.
7,296,534 B2 11/2007 Fink
8,161,906 B2 * 4/2012 Kadkhodayan et al. .. 118/723 E
8,206,506 B2 * 6/2012 Kadkhodayan et al. ...... 118/715
8,221,582 B2 * 7/2012 Patrick et al. ............ 156/345.34
8,272,346 B2 * 9/2012 Bettencourt et al. ...... 118/723 E
8,313,805 B2 * 11/2012 Kadkhodayan et al. ... 427/248.1
8,402,918 B2 * 3/2013 Kadkhodayan et al. .. 118/723 E
8,414,719 B2 * 4/2013 Patrick et al. ..................... 156/1
8,419,959 B2 * 4/2013 Bettencourt et al. ............ 216/67
8,470,127 B2 * 6/2013 de la Llera et al. ...... 156/345.43
2001/0000104 A1 4/2001 Li et al.
2002/0048963 A1 4/2002 Campbell et al.
2002/0139479 A1 10/2002 Antolik
2002/0179245 A1 12/2002 Masuda et al.
2003/0127806 A1 7/2003 Belchuk
2003/0185729 A1 10/2003 Ko et al.
2004/0074609 A1 4/2004 Fischer et al.
2004/0108301 A1 6/2004 Hao et al.
2004/0173313 A1 9/2004 Beach
2005/0056218 A1 3/2005 Sun et al.
2005/0116427 A1 6/2005 Seidel et al.
2005/0133160 A1 6/2005 Kennedy et al.
2005/0150456 A1 7/2005 Senzaki et al.
2005/0241765 A1 11/2005 Dhindsa et al.
2005/0276928 A1 12/2005 Okumura et al.
2006/0000803 A1 1/2006 Koshiishi et al.
2006/0016559 A1 1/2006 Kobayashi et al.
2006/0037701 A1 2/2006 Koshiishi et al.
2006/0042754 A1 3/2006 Yoshida et al.
2006/0043067 A1 3/2006 Kadkhodayan et al.
2006/0066247 A1 3/2006 Koshiishi et al.
2006/0075969 A1 4/2006 Fischer
2006/0090704 A1 5/2006 Ide et al.
2006/0108069 A1 5/2006 Gernert
2006/0207502 A1 9/2006 Dhindsa et al.
2006/0236934 A1 10/2006 Choi et al.
2006/0283551 A1 12/2006 Son
2006/0283552 A1 12/2006 Rogers
2007/0032081 A1 2/2007 Chang et al.
2007/0044716 A1 3/2007 Tetsuka et al.
2007/0068629 A1 3/2007 Shih et al.
2007/0131350 A1 6/2007 Ricci et al.
2007/0181868 A1 8/2007 Fujiwara et al.
2007/0187038 A1 8/2007 Ren et al.
2007/0215580 A1 9/2007 Koshiishi et al.
2007/0235660 A1 10/2007 Hudson
2007/0284045 A1 12/2007 Fischer et al.
2007/0284246 A1 12/2007 Keii et al.
2008/0087641 A1 4/2008 De La Llera et al.
2008/0090417 A1 4/2008 De La Llera et al.
2008/0099120 A1 5/2008 Larson et al.
2008/0141941 A1 6/2008 Augustino et al.
2008/0227301 A1 9/2008 Fang et al.
2008/0308228 A1 12/2008 Stevenson et al.
2008/0308229 A1 12/2008 Patrick et al.
2009/0081878 A1 3/2009 Dhindsa
2009/0095220 A1 4/2009 Meinhold et al.
2009/0095424 A1 4/2009 Bettencourt et al.
2009/0163034 A1 6/2009 Larson et al.
2009/0223932 A1 9/2009 Hida et al.
2009/0236040 A1 9/2009 Patrick et al.
2010/0000683 A1 1/2010 Kadkhodayan et al.
2010/0003824 A1 * 1/2010 Kadkhodayan et al. ...... 438/710
2010/0003829 A1 * 1/2010 Patrick et al. ................. 438/758
2010/0038033 A1 2/2010 Hardin et al.
2010/0252197 A1 10/2010 Kadkhodayan et al.
2010/0261354 A1 * 10/2010 Bettencourt et al. .......... 438/710
2011/0083809 A1 * 4/2011 de la Llera et al. ...... 156/345.34
2012/0175062 A1 * 7/2012 de la Llera et al. ...... 156/345.34

FOREIGN PATENT DOCUMENTS

JP 09-013172 A 1/1997
JP 09-245994 9/1997
JP 2001085398 A 3/2001
JP 2002-198353 A 7/2002
WO WO2009/114175 A2 9/2009

OTHER PUBLICATIONS

U.S. Appl. No. 61/036,862, filed Mar. 14, 2008.
Utility U.S. Appl. No. 12/884,269, filed Sep. 17, 2010.
Utility U.S. Appl. No. 12/903,412, filed Oct. 13, 2010.
Utility U.S. Appl. No. 12/872,980, filed Aug. 31, 2010.
Utility U.S. Appl. No. 12/872,982, filed Aug. 31, 2010.
Utility U.S. Appl. No. 12/872,984, filed Aug. 31, 2010.
Official Action dated Jan. 22, 2010 for Chinese Patent Appln. No. 201020114128.8.
International Search Report and Written Opinion mailed Feb. 24, 2010 for PCT/US2009/003953.

* cited by examiner

SHOWERHEAD ELECTRODE

BACKGROUND

Disclosed herein is a showerhead electrode of a plasma processing chamber in which semiconductor components can be manufactured. The fabrication of an integrated circuit chip typically begins with a thin, polished slice of high-purity, single crystal semiconductor material substrate (such as silicon or germanium) called a "substrate." Each substrate is subjected to a sequence of physical and chemical processing steps that form the various circuit structures on the substrate. During the fabrication process, various types of thin films may be deposited on the substrate using various techniques such as thermal oxidation to produce silicon dioxide films, chemical vapor deposition to produce silicon, silicon dioxide, and silicon nitride films, and sputtering or other techniques to produce other metal films.

After depositing a film on the semiconductor substrate, the unique electrical properties of semiconductors are produced by substituting selected impurities into the semiconductor crystal lattice using a process called doping. The doped silicon substrate may then be uniformly coated with a thin layer of photosensitive, or radiation sensitive material, called a "resist." Small geometric patterns defining the electron paths in the circuit may then be transferred onto the resist using a process known as lithography. During the lithographic process, the integrated circuit pattern may be drawn on a glass plate called a "mask" and then optically reduced, projected, and transferred onto the photosensitive coating.

The lithographed resist pattern is then transferred onto the underlying crystalline surface of the semiconductor material through a process known as plasma etching. Vacuum processing chambers are generally used for etching and chemical vapor deposition (CVD) of materials on substrates by supplying an etching or deposition gas to the vacuum chamber and application of a radio frequency (RF) field to the gas to energize the gas into a plasma state.

SUMMARY

Described herein is a showerhead electrode for a showerhead electrode assembly in a capacitively coupled plasma processing chamber, the showerhead electrode assembly comprising a backing plate having gas injection holes extending between upper and lower faces thereof, a plurality of stud/socket assemblies and cam shafts, an alignment ring, and a plurality of alignment pins; the showerhead electrode comprising: a plasma exposed surface on a lower face thereof; a mounting surface on an upper face thereof; a plurality of gas injection holes extending between the plasma exposed surface and the mounting surface thereof and arranged in a pattern matching the gas injection holes in the backing plate; wherein the gas injection holes have a diameter less than or equal to 0.04 inch and are arranged in a pattern with one center gas injection hole at a center of the electrode and eight concentric rows of gas injection holes, the first row having seven gas injection holes located at a radial distance of about 0.6-0.7 inch from the center of the electrode; the second row having seventeen gas injection holes located at a radial distance of about 1.3-1.4 inches from the center of the electrode; the third row having twenty-eight gas injection holes located at a radial distance of about 2.1-2.2 inches from the center of the electrode; the fourth row having forty gas injection holes located at a radial distance of about 2.8-3.0 inches from the center of the electrode; the fifth row having forty-eight gas injection holes located at a radial distance of about 3.6-3.7 inches from the center of the electrode; the sixth row having fifty-six gas injection holes located at a radial distance of about 4.4-4.5 inches from the center of the electrode; the seventh row having sixty-four gas injection holes located at a radial distance of about 5.0-5.1 inches from the center of the electrode; the eighth row having seventy-two gas injection holes located at a radial distance of about 5.7-5.8 inches from the center of the electrode; the gas injection holes in each row are azimuthally equally spaced.

DETAILED DESCRIPTION

A parallel plate capacitively coupled plasma reaction chamber typically consists of a vacuum chamber with an upper electrode assembly and a lower electrode assembly positioned therein. A substrate (usually a semiconductor) to be processed is covered by a suitable mask and placed directly on the lower electrode assembly. A process gas such as $CF_4$, $CHF_3$, $CClF_3$, HBr, $Cl_2$, $SF_6$ or mixtures thereof is introduced into the chamber with gases such as $O_2$, $N_2$, He, Ar or mixtures thereof. The chamber is maintained at a pressure typically in the millitorr range. The upper electrode assembly includes a showerhead electrode with gas injection hole(s), which permit the gas to be uniformly dispersed through the upper electrode assembly into the chamber. One or more radio-frequency (RF) power supplies transmit RF power into the vacuum chamber and dissociate neutral process gas molecules into a plasma. Highly reactive radicals in the plasma are forced towards the substrate surface by an electrical field between the upper and lower electrodes. The surface of the substrate is etched or deposited on by chemical reaction with the radicals. The upper electrode assembly can include a single (monolithic) electrode or inner and outer electrodes, the monolithic electrode and inner electrode attached to a backing plate made of a different material. The monolithic/inner electrode is heated by the plasma and/or a heater arrangement during operation and may warp, which can adversely affect uniformity of processing rate across the substrate. In addition, differential thermal expansion of the monolithic/inner electrode and the backing plate can lead to rubbing therebetween during repeated thermal cycles. Rubbing can produce particulate contaminants that degrade the device yield from the substrate.

To reduce warping of the monolithic/inner electrode, described herein is a showerhead electrode assembly including a plurality of cam locks engaged with the interior of a mounting surface of the monolithic/inner electrode. The monolithic/inner electrode is not edge clamped with a clamp ring around the outer edge thereof. Instead, attachment to the backing plate is achieved solely by cam locks which fasten the monolithic/inner electrode to the backing plate at a plurality of positions distributed across the electrode.

Figure 1A:
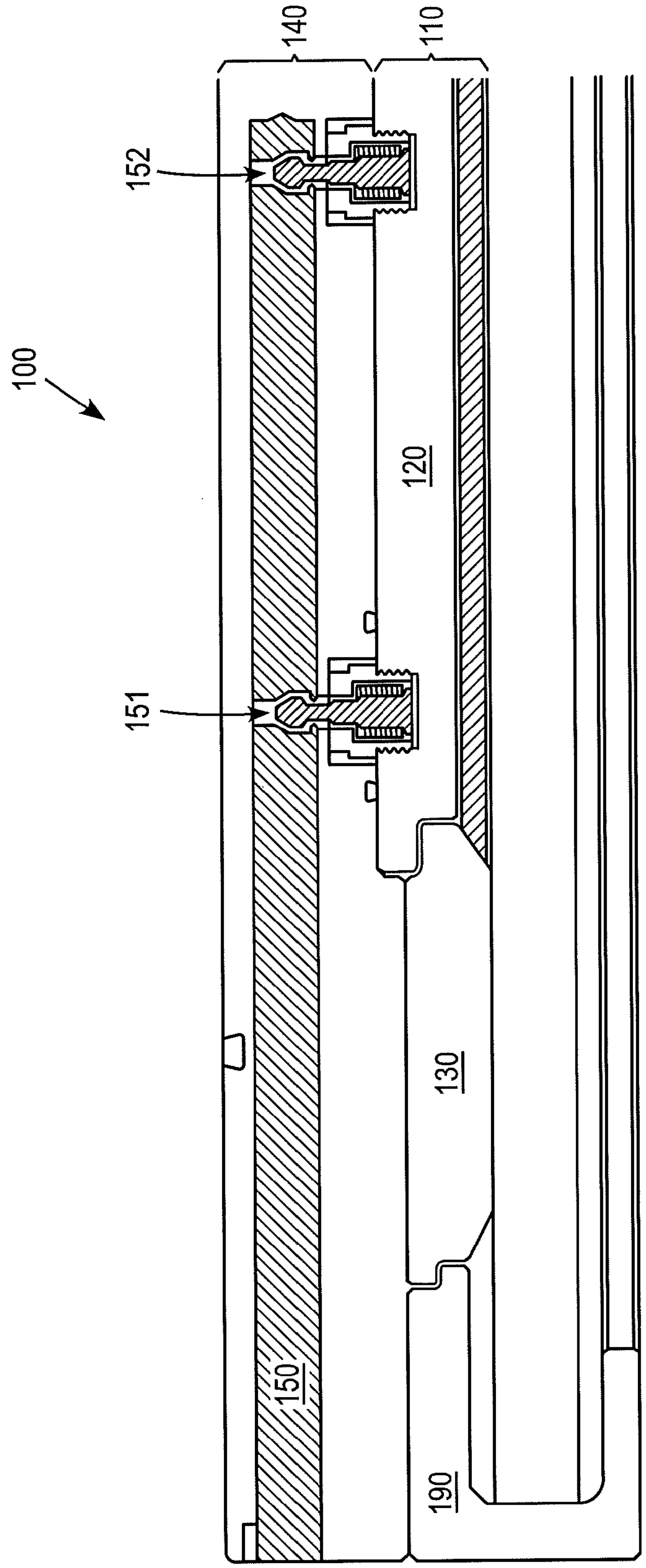
FIG. 1A shows a partial cross-sectional view of a showerhead electrode assembly along a diameter for a capacitively coupled plasma reaction chamber, according to one embodiment.

FIG. 1A shows a partial cross-sectional view of a portion of a showerhead electrode assembly 100 of a plasma reaction chamber for etching semiconductor substrates. As shown in FIG. 1A, the showerhead electrode assembly 100 includes an upper electrode 110, and a backing plate 140. The assembly 100 can also include a thermal control plate (not shown), a temperature controlled upper plate (top plate) (not shown) having liquid flow channels therein. The upper electrode 110 preferably includes an inner electrode 120, and an outer electrode 130. The upper electrode 110 can also be a monolithic showerhead electrode. The upper electrode 110 may be made of a conductive high purity material such as single crystal silicon, polycrystalline silicon, silicon carbide or other suitable material. The inner electrode 120 is a consumable part which must be replaced periodically. An annular shroud 190 with a C-shaped cross section surrounds the upper electrode 110. Details of the annular shroud 190 are described in commonly owned U.S. Provisional Patent Application Ser. Nos. 61/238,656, 61/238,665, 61/238,670, all filed on Aug. 31, 2009, the disclosures of which are hereby incorporated by reference. The backing plate 140 is mechanically secured to the inner electrode 120, the outer electrode 130 and the shroud 190 with cam locks described below. The cross section in FIG. 1A is along a cam shaft 150 shared by two cam locks 151 and 152 engaged on the inner electrode 120.

The showerhead electrode assembly 100 as shown in FIG. 1A is typically used with an electrostatic chuck (not shown) forming part of a flat lower electrode assembly on which a substrate is supported spaced 1 to 5 cm below the upper electrode 110. An example of a parallel plate type reactor is the Exelan™ dielectric etch reactor, made by Lam Research Corporation of Fremont, Calif. Such chucking arrangements provide temperature control of the substrate by supplying backside helium (He) pressure, which controls the rate of heat transfer between the substrate and the chuck.

During use, process gas from a gas source is supplied to the upper electrode 110 through one or more passages in the backing plate which permit process gas to be supplied to a single zone or multiple zones above the substrate.

The inner electrode 120 is preferably a planar disk or plate. The inner electrode 120 can have a diameter smaller than, equal to, or larger than a substrate to be processed, e.g., up to 300 mm, if the plate is made of single crystal silicon, which is the diameter of currently available single crystal silicon material used for 300 mm substrates. For processing 300 mm substrates, the outer electrode 130 is adapted to expand the diameter of the inner electrode 120 from about 12 inches to about 17 inches (as used herein, "about" refers to ±10%). The outer electrode 130 can be a continuous member (e.g., a single crystal silicon, polycrystalline silicon, silicon carbide or other suitable material in the form of a ring) or a segmented member (e.g., 2-6 separate segments arranged in a ring configuration, such as segments of single crystal silicon, polycrystalline silicon, silicon carbide or other material). To supply process gas to the gap between the substrate and the upper electrode 110, the inner electrode 120 is provided with a plurality of gas injection holes (not shown), which are of a size and distribution suitable for supplying a process gas, which is energized into a plasma in a reaction zone beneath the upper electrode 110.

Figure 1B:
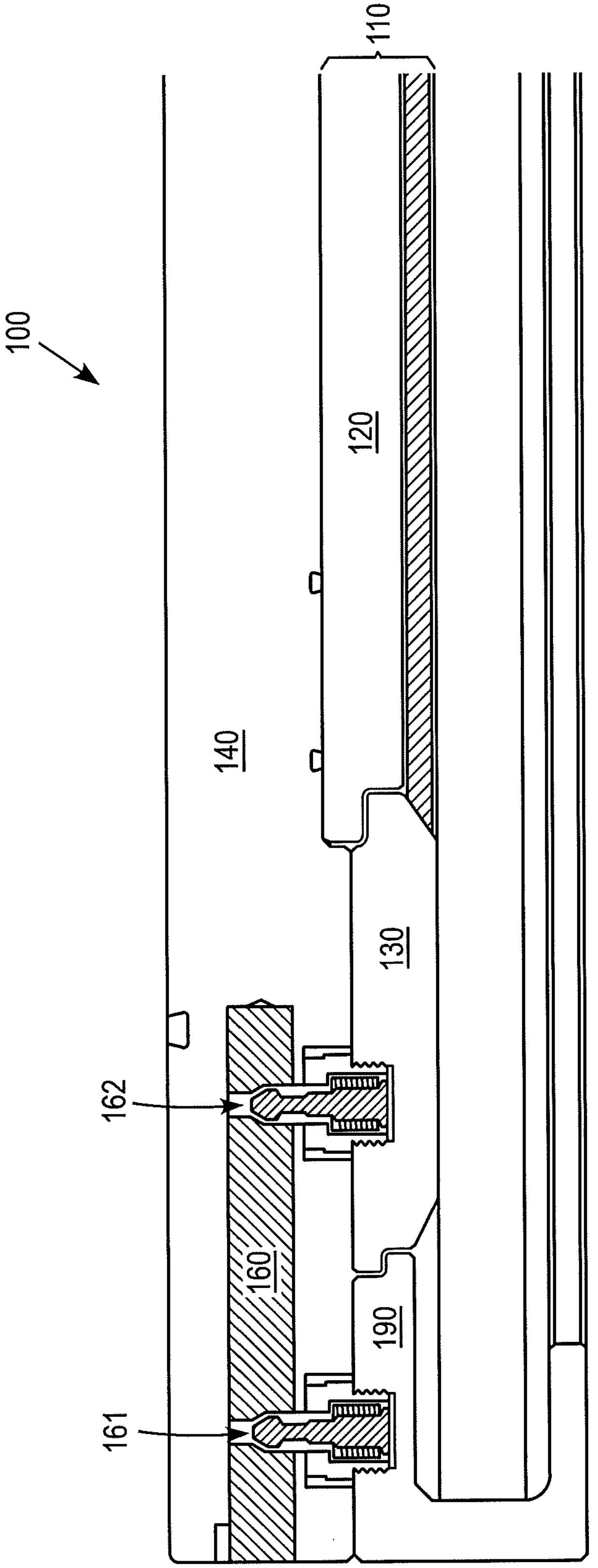
FIG. 1B shows a partial cross-sectional view of the showerhead electrode assembly of FIG. 1A along another diameter.
Figure 1C:
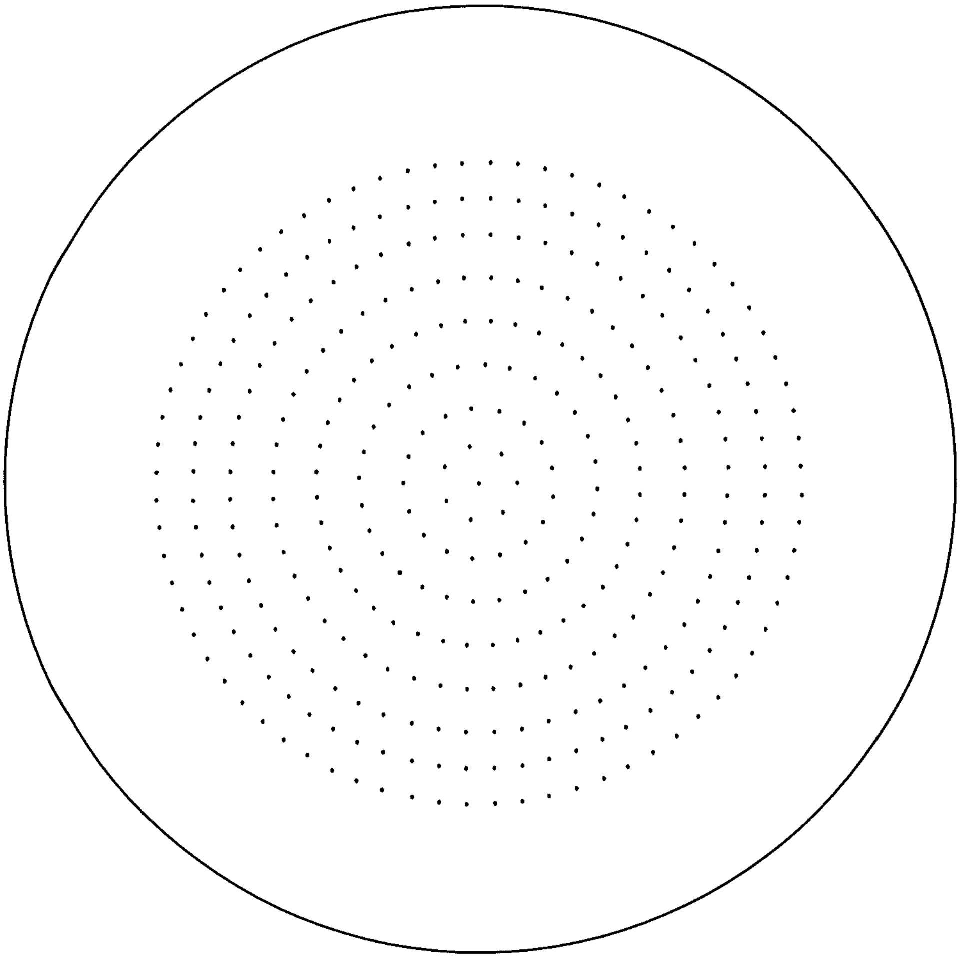
FIG. 1C shows a showerhead electrode with a preferred gas hole pattern.

Details of the gas injection hole pattern can be critical to some plasma processes. Preferably, the diameter of the gas injection holes 106 is less than or equal to 0.04 inch; more preferably, the diameter of the gas injection holes 106 is between 0.01 and 0.03 inch; most preferably, the diameter of the gas injection holes 106 is 0.02 inch. A preferred gas injection hole pattern is shown in FIG. 1C which can be used on a (monolithic) single piece electrode (such as the electrode as described in commonly assigned U.S. Published Patent Application No. 2010/0003829, which is hereby incorporated by reference) or inner electrode of an assembly having an inner electrode and outer annular electrode surrounding the inner electrode (such as the inner electrode as described in commonly assigned U.S. Published Patent Application No. 2010/0003824, which is hereby incorporated by reference), one gas injection hole is located at the center of the electrode 120; the other gas injection holes are arranged in eight concentric rows with 7 gas injection holes in the first row located about 0.6-0.7 (e.g. 0.68) inch from the center of the electrode, 17 gas injection holes in the second row located about 1.3-1.4 (e.g. 1.34) inch from the center, 28 gas injection holes in the third row located about 2.1-2.2 (e.g. 2.12) inches from the center, 40 gas injection holes in the fourth row located about 2.8-3.0 (e.g. 2.90) inches from the center, 48 gas injection holes in the fifth row located about 3.6-3.7 (e.g. 3.67) inches from the center, 56 gas injection holes in the sixth row located about 4.4-4.5 (e.g. 4.45) inches from the center, 64 gas injection holes in the seventh row located about 5.0-5.1 (e.g. 5.09) inches from the center, and 72 gas injection holes in the eighth row located about 5.7-5.8 (e.g. 5.73) inches from the center. The gas injection holes in each of these rows are azimuthally evenly spaced.

Single crystal silicon is a preferred material for plasma exposed surfaces of the upper electrode 110. High-purity, single crystal silicon minimizes contamination of substrates during plasma processing as it introduces only a minimal amount of undesirable elements into the reaction chamber, and also wears smoothly during plasma processing, thereby minimizing particles. Alternative materials including composites of materials that can be used for plasma-exposed surfaces of the upper electrode 110 include polycrystalline silicon, $Y_2O_3$, SiC, $Si_3N_4$, and AlN, for example.

In an embodiment, the showerhead electrode assembly 100 is large enough for processing large substrates, such as semiconductor substrates having a diameter of 300 mm. For 300 mm substrates, the inner electrode 120 is at least 300 mm in diameter. However, the showerhead electrode assembly 100 can be sized to process other substrate sizes.

The backing plate 140 is preferably made of a material that is chemically compatible with process gases used for processing semiconductor substrates in the plasma processing chamber, has a coefficient of thermal expansion closely matching that of the electrode material, and/or is electrically and thermally conductive. Preferred materials that can be used to make the backing plate 140 include, but are not limited to, graphite, SIC, aluminum (Al), or other suitable materials.

The backing plate 140 is preferably attached to the thermal control plate with suitable mechanical fasteners, which can be threaded bolts, screws, or the like. For example, bolts can be inserted in holes in the thermal control plate and screwed into threaded openings in the backing plate 140. The thermal control plate is preferably made of a machined metallic material, such as aluminum, an aluminum alloy or the like. The upper temperature controlled plate is preferably made of aluminum or an aluminum alloy.

The outer electrode 130 and the annular shroud 190 can be mechanically attached to the backing plate 140 by cam locks. FIG. 1B shows a cross section of the showerhead electrode assembly 100 along another cam shaft 160 shared by two cam locks 161 and 162 engaged on the annular shroud 190 and the outer electrode 130, respectively.

The cam locks shown in FIGS. 1A and 1B can be the cam locks as described in commonly-assigned WO2009/114175 (published on Sep. 17, 2009) and/or U.S. Patent Application Publication No. 2010/0003829, the disclosures of which are hereby incorporated by reference.

Figure 2A:
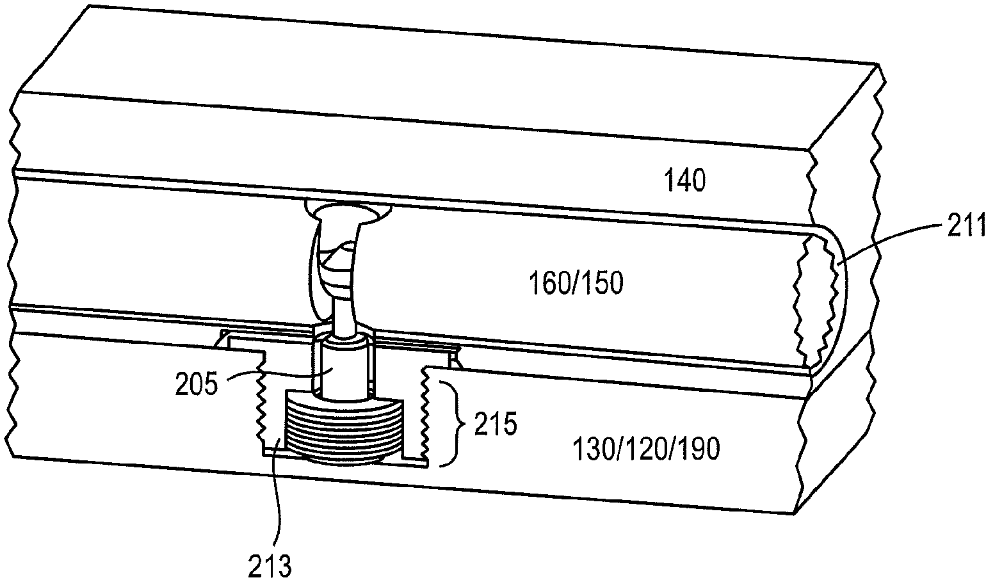
FIG. 2A is a three-dimensional representation of an exemplary cam lock for attaching an outer electrode, an inner electrode and an annular shroud in the showerhead electrode assembly shown in FIGS. 1A and 1B.

With reference to FIG. 2A, a three-dimensional view of an exemplary cam lock includes portions of the outer electrode 130 or the inner electrode 120 or the annular shroud 190, and the backing plate 140. The cam lock is capable of quickly, cleanly, and accurately attaching the outer electrode 130, inner electrode 1210 or the annular shroud 190 to the backing plate 140.

The cam lock includes a stud (locking pin) 205 mounted into a socket 213. The stud may be surrounded by a disc spring stack 215, such, for example, stainless steel Belleville washers. The stud 205 and disc spring stack 215 may then be press-fit or otherwise fastened into the socket 213 through the use of adhesives or mechanical fasteners. The stud 205 and the disc spring stack 215 are arranged into the socket 213 such that a limited amount of lateral movement is possible between the outer electrode 130 or the inner electrode 120 or the annular shroud 190, and the backing plate 140. Limiting the amount of lateral movement allows for a tight fit between the outer electrode 130 or the inner electrode 120 or the annular shroud 190, and the backing plate 140, thus ensuring good thermal contact, while still providing some movement to account for differences in thermal expansion between the two parts. Additional details on the limited lateral movement feature are discussed in more detail, below.

In a specific exemplary embodiment, the socket 213 is fabricated from high strength Torlon®. Alternatively, the socket 213 may be fabricated from other materials possessing certain mechanical characteristics such as good strength and impact resistance, creep resistance, dimensional stability, radiation resistance, and chemical resistance may be readily employed. Various materials such as polyamide-imide, acetals, and ultra-high molecular weight polyethylene materials may all be suitable. High temperature-specific plastics and other related materials are not required for forming the socket 213 as 230° C. is a typical maximum temperature encountered in applications such as etch chambers. Generally, a typical operating temperature is closer to 130° C.

The cam shaft 160 or 150 is mounted into a bore machined into the backing plate 140. In a typical application for an etch chamber designed for 300 mm semiconductor substrates, eight or more cam shafts may be spaced around the periphery of the backing plate 140.

The stud 205 and cam shaft 160 or 150 may be machined from stainless steel (e.g., 316, 316L, 17-7, NITRONIC-60, etc.) or any other material providing good strength and corrosion resistance.

Figure 2B:
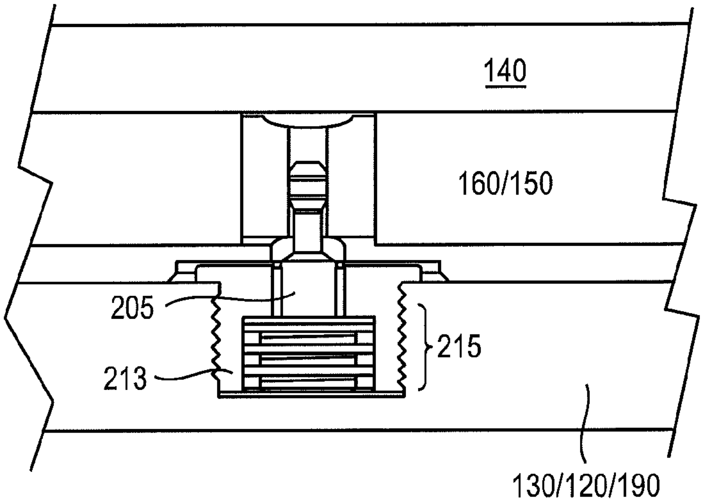
FIG. 2B is a partial cross-sectional view of the exemplary cam lock of FIG. 2A.

Referring now to FIG. 2B, a cross-sectional view of the cam lock further exemplifies how the cam lock operates by pulling the outer electrode 130, the inner electrode 120 or the annular shroud 190 in close proximity to the backing plate 140. The stud 205/disc spring stack 215/socket 213 assembly is mounted into the outer electrode 130, the inner electrode 120 or the annular shroud 190. As shown, the assembly may be screwed, by means of external threads on the socket 213 into a threaded socket in the outer electrode 130, the inner electrode 120 or the annular shroud 190.

Figure 3:
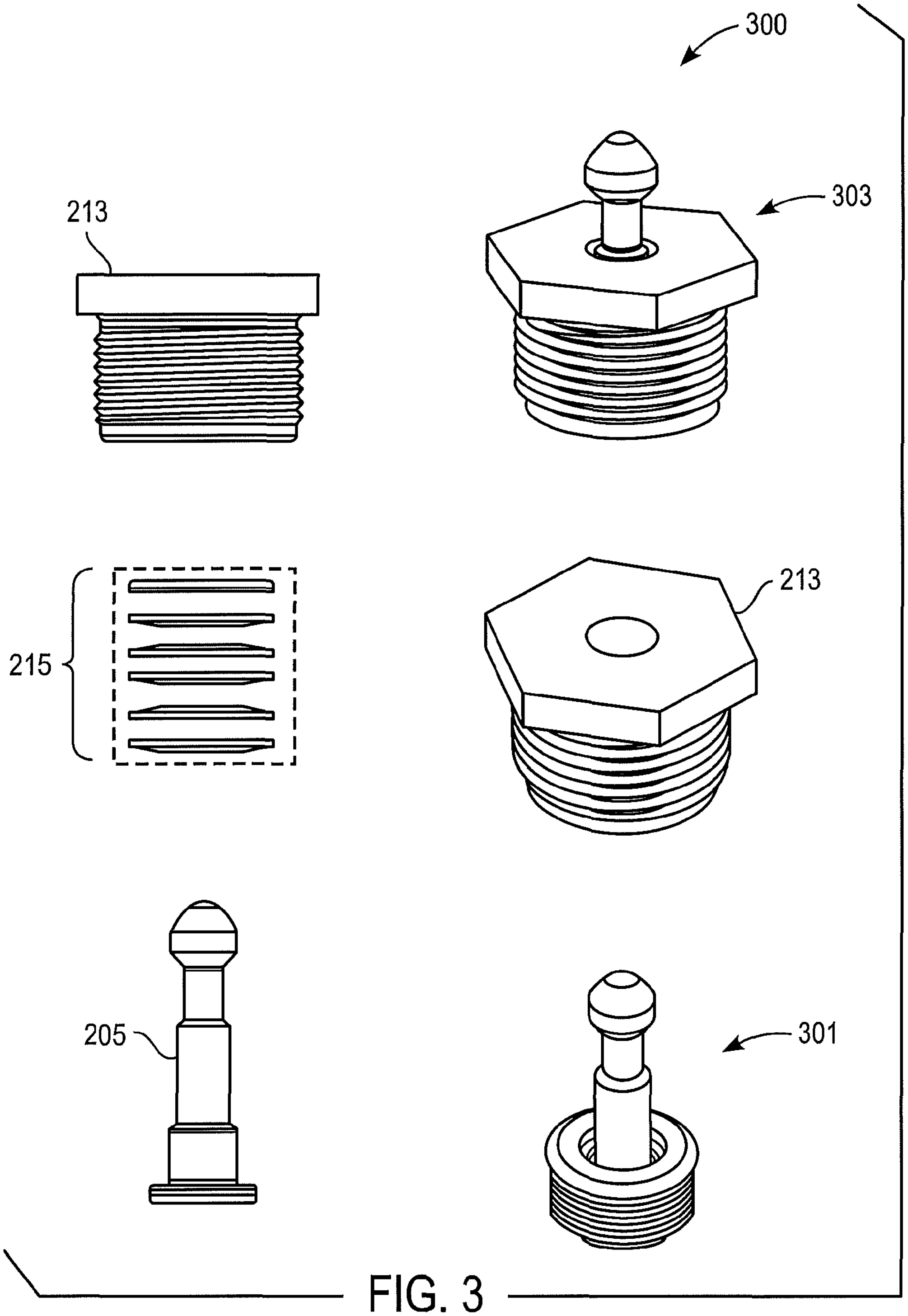
FIG. 3 shows side-elevation and assembly drawings of an exemplary stud used in the cam lock of FIGS. 2A-2B.

In FIG. 3, an elevation and assembly view 300 of the stud 205 having an enlarged head, disc spring stack 215, and socket 213 provides additional detail into an exemplary design of the cam lock. In a specific exemplary embodiment, a stud/disc spring assembly 301 is press fit into the socket 213. The socket 213 has an external thread and a hexagonal top member allowing for easy insertion into the outer electrode 130, the inner electrode 120 or the annular shroud 190 (see FIGS. 2A and 2B) with light torque (e.g., in a specific exemplary embodiment, about 20 inch-pounds). As indicated above, the socket 213 may be machined from various types of plastics. Using plastics minimizes particle generation and allows for a gall-free installation of the socket 213 into a mating socket on the outer electrode 130, the inner electrode 120 or the annular shroud 190.

The stud/socket assembly 303 illustrates an inside diameter in an upper portion of the socket 213 being larger than an outside diameter of a mid-section portion of the stud 205. The difference in diameters between the two portions allows for the limited lateral movement in the assembled cam lock as discussed above. The stud/disc spring assembly 301 is maintained in rigid contact with the socket 213 at a base portion of the socket 213 while the difference in diameters allows for some lateral movement. (See also, FIG. 2B.)

Figure 4A:
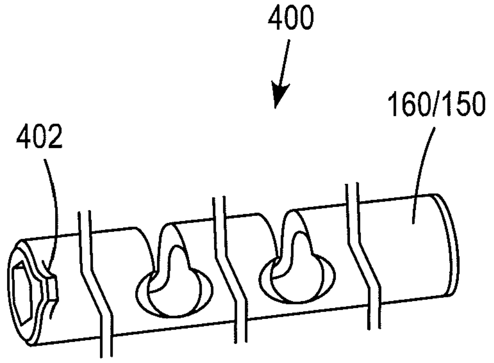
FIG. 4A shows a side-elevation view of an exemplary cam shaft used in the cam lock of FIGS. 2A and 2B.
Figure 4C:
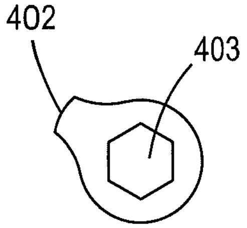
FIG. 4C shows an end view of the cam shaft of FIG. 4A.
Figure 4B:
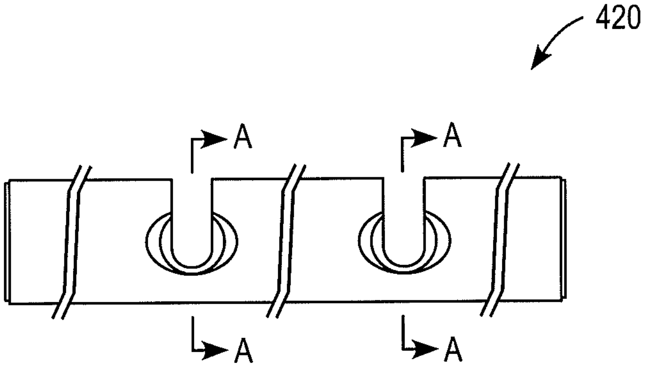
FIG. 4B shows a side view of the cam shaft of FIG. 4A.

With reference to FIG. 4A, a perspective view 400 of the cam shaft 160 or 150 also indicates a keying stud 402 and a hex opening 403 on one end of the cam shaft 160 or 150.

For example, with continued reference to FIGS. 4A, 2A and 2B, the cam lock is assembled by inserting the cam shaft 160 or 150 into a backing plate bore 211. The keying stud 402 limits rotational travel of the cam shaft 160 or 150 in the backing plate bore 211 by interfacing with a step on an entrance of the bore 211 as shown in FIG. 4E. The cam shaft 160 or 150 has two internal eccentric cutouts. In the cam shaft 160, one cutout engages an enlarged head of a stud 205 on the outer electrode 130 and the other cutout engages an enlarged head of a stud 205 on the annular shroud 190. In the cam shaft 150, each of the two cutouts engages an enlarged head of a stud 205 on the inner electrode 120. The cam shaft 160 or 150 may first be turned in one direction through use of the hex opening 403, for example, counter-clockwise, to allow entry of the studs 205 into the cam shaft 160 or 150, and then turned clockwise to fully engage and lock the studs 205. The clamp force required to hold the outer electrode 130, the inner electrode 120 or the annular shroud 190 to the backing plate 140 is supplied by compressing the disc spring stacks 215 beyond their free stack height. As the disc spring stacks 215 compress, the clamp force is transmitted from individual springs in the disc spring stacks 215 to the sockets 213 and through the outer electrode 130, the inner electrode 120 or the annular shroud 190 to the backing plate 140.

In an exemplary mode of operation, the cam shaft 160 or 150 is inserted into the backing plate bore 211. The cam shaft 160 or 150 is rotated counterclockwise to its full rotational travel. The stud/socket assemblies 303 (FIG. 3) lightly torqued into the outer electrode 130, the inner electrode 120 and/or the annular shroud 190 are then inserted into vertically extending through holes below the horizontally extending backing plate bore 211 such that the heads of the studs 205 engage in the eccentric cutouts in the cam shaft 160 or 150. The outer electrode 130, the inner electrode 120 or the annular shroud 190 is held against the backing plate 140 and the cam shaft 160 or 150 is rotated clockwise until the keying pin is limited by the step on the entrance of the bore 211. The exemplary mode of operation may be reversed to dismount the outer electrode 130, the inner electrode 120 or the annular shroud 190 from the backing plate 140.

Figure 4D:
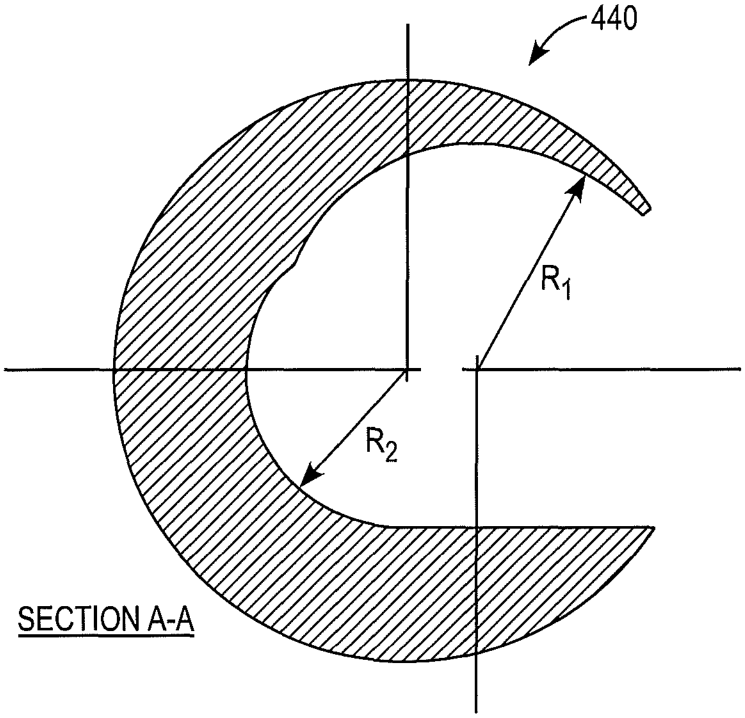
FIG. 4D shows a cross-sectional view of an exemplary cutter-path edge of a portion of the cam shaft of FIG. 4B.
Figure 4E:
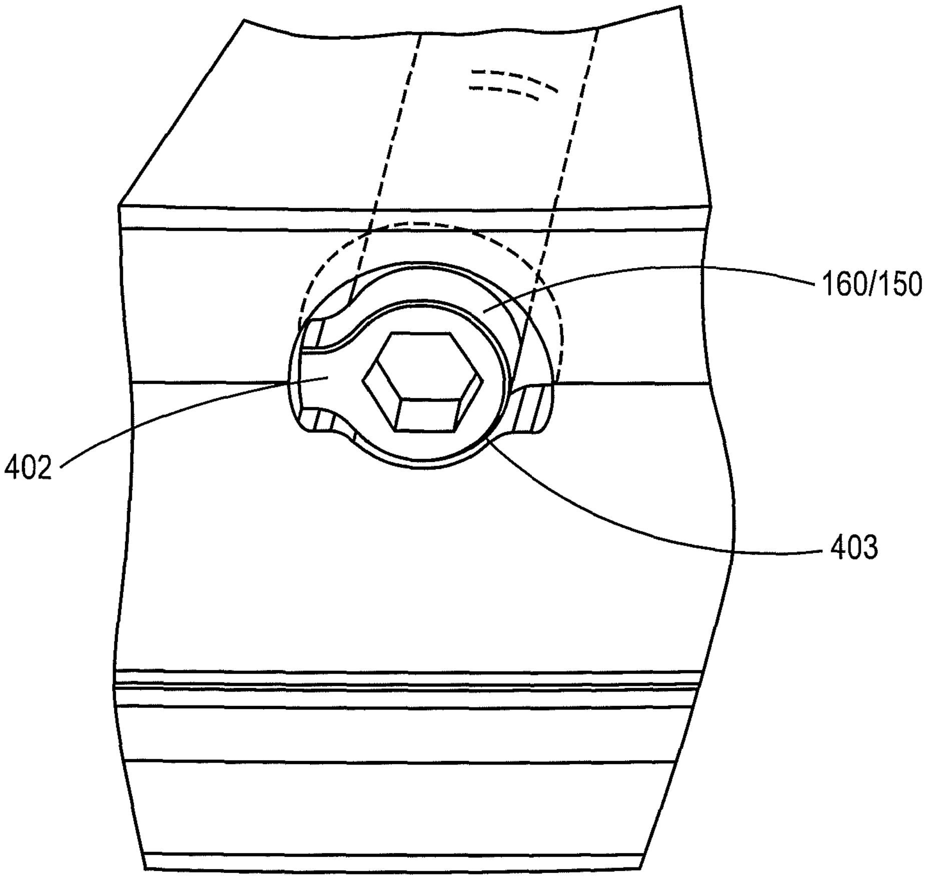
FIG. 4E shows a partial perspective view of the cam shaft in FIG. 4A, mounted in a bore in a backing plate.

With reference to FIG. 4D, a sectional view A-A of the side-elevation view 420 of the cam shaft 160 or 150 of FIG. 4A indicates a cutter path edge 440 by which the head of the stud 205 is fully secured.

FIGS. 5A-G show details of the inner electrode 120. The inner electrode 120 is preferably a plate of high purity (less than 10 ppm impurities) low resistivity (0.005 to 0.02 ohm-cm) single crystal silicon.

Figure 5A:
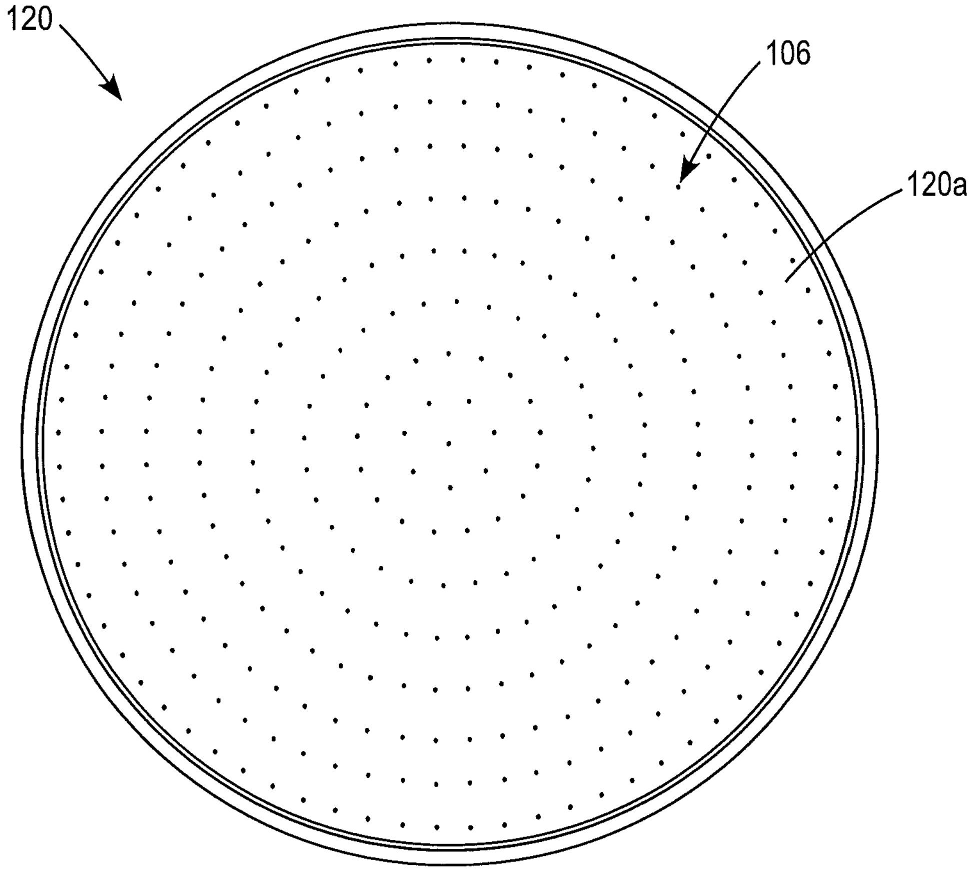
FIG. 5A is a bottom view of an inner electrode in the showerhead electrode assembly in FIGS. 1A-1B, showing a plasma exposed surface.

FIG. 5A is a bottom view of the inner electrode 120, showing the plasma exposed surface 120*a*. Gas injection holes 106 of suitable diameter and/or configuration extend from the mounting surface 120*b* to the plasma exposed surface 120*a* (FIG. 5B) and can be arranged in any suitable pattern. Preferably, the gas injection holes 106 are arranged in the pattern as shown in FIG. 1C.

Figure 5B:
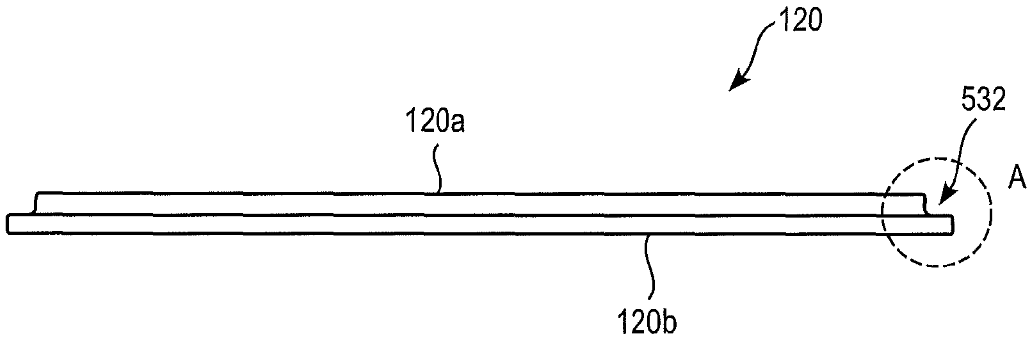
FIG. 5B is a cross-sectional view of the inner electrode in FIG. 5A.
Figure 5C:
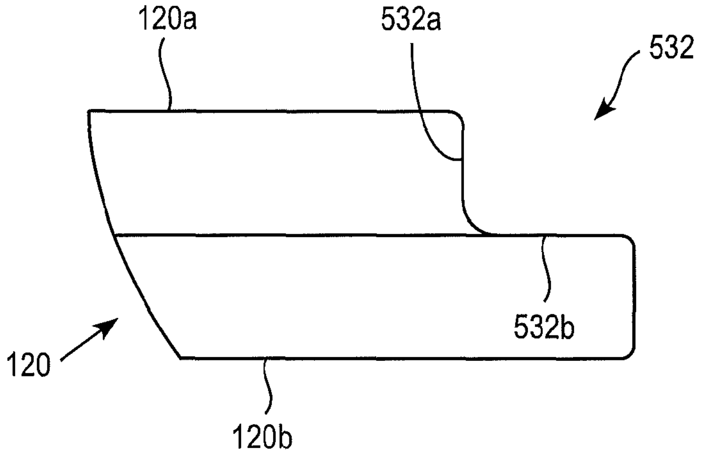
FIG. 5C is an enlarged view of the area A in FIG. 5B.

FIG. 5B is a cross-sectional view of the inner electrode 120 along a diameter thereof. The outer circumferential surface includes a single annular step 532. FIG. 5C is an enlarged view of the area A in FIG. 5B. The step 532 extends completely around the inner electrode 120. In a preferred embodiment, the inner electrode 120 has a thickness of about 0.40 inch and an outer diameter of about 12.5 inches; the step 532 has an inner diameter of about 12.0 inches and an outer diameter of about 12.5 inches. The step 532 has a vertical surface 532*a* about 0.20 inch long and a horizontal surface 532*b* about 0.25 inch long. An interior corner between the surfaces 532*a* and 532*b* has a fillet with a radius of about 0.06 inch.

Figure 5D:
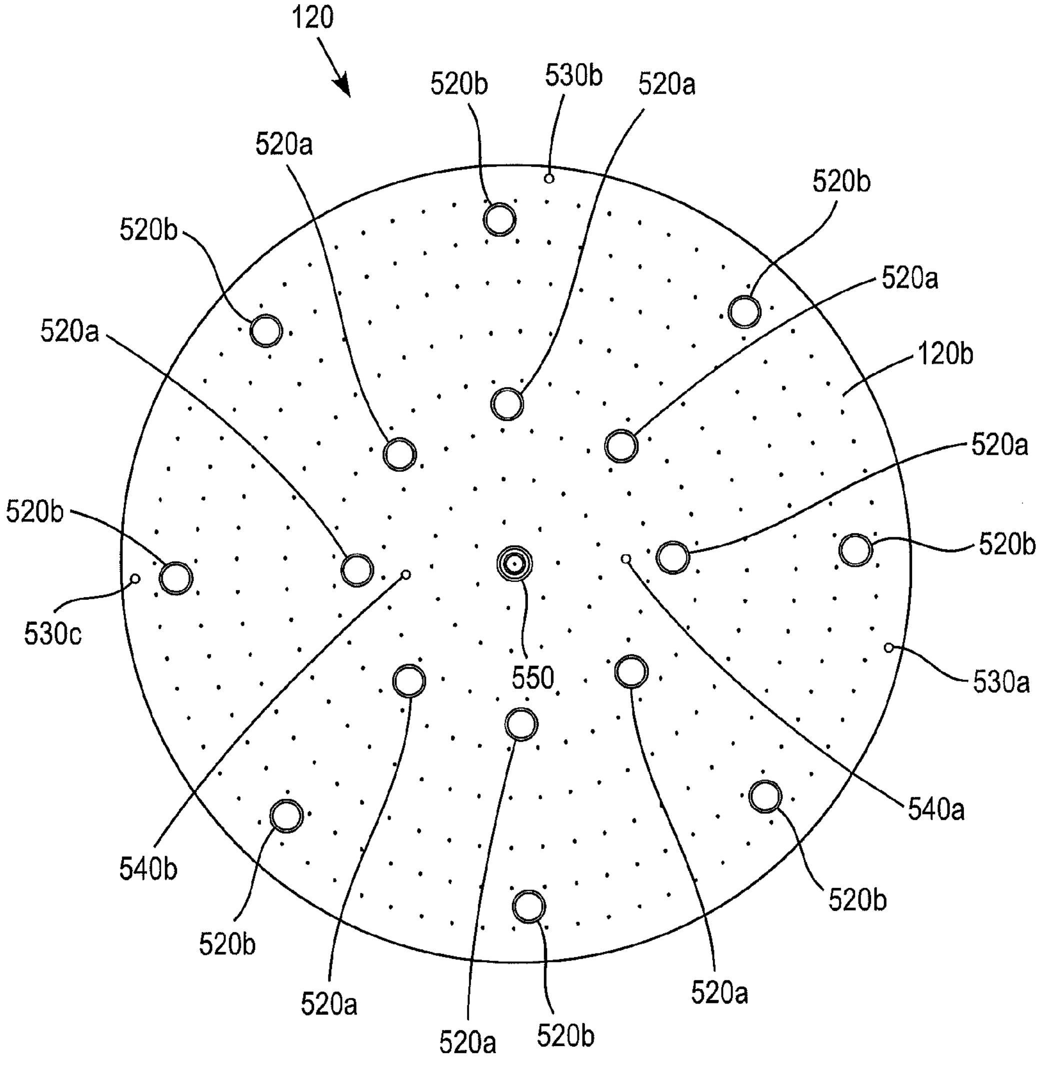
FIG. 5D is a top view of the inner electrode in FIG. 5A, showing a mounting surface.
Figure 5E:
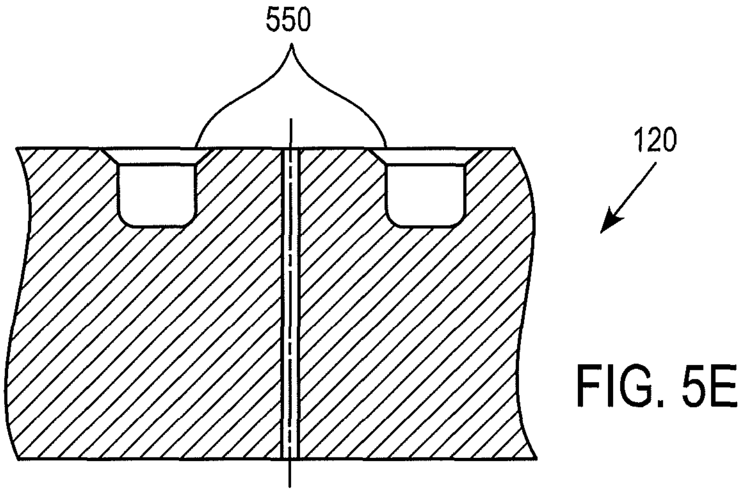
FIG. 5E is a partial cross-sectional view of the inner electrode in FIG. 5D across an annular groove 550.
Figure 5F:
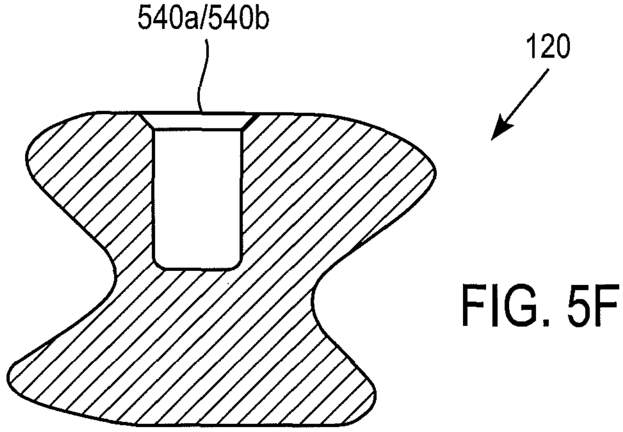
FIG. 5F is a partial cross-sectional view of the inner electrode in FIG. 5D across a hole 540*a* or 540*b* in FIG. 5D.
Figure 5G:
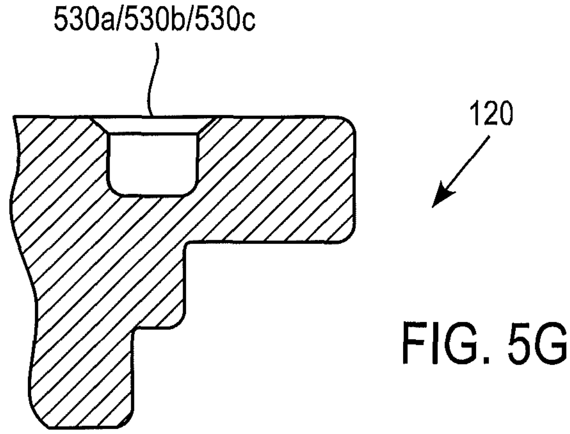
FIG. 5G is a partial cross-sectional view of the inner electrode in FIG. 5D across a hole 530*a*, 530*b* or 530*c*.

FIG. 5D is a top view of the inner electrode 120, showing the mounting surface 120*b*. The mounting surface 120*b* includes an annular groove 550 (details shown in FIG. 5E) concentric with the inner electrode 120, the annular groove 550 for an alignment ring 550' having an inner diameter of about 0.24 inch, an outer diameter of about 0.44 inch, a depth of at least 0.1 inch, 45° chamfers of about 0.02 inch wide on entrance edges, and a fillet of a radius between 0.015 and 0.03 inch on the bottom corners.

The mounting surface 120*b* also includes two smooth (unthreaded) blind holes 540*a* and 540*b* configured to receive alignment pins (details shown in FIG. 5F) located at a radius between 1.72 and 1.73 inches from the center of the inner electrode 120. The blind hole 540*b* is offset by about 175° clockwise from the blind hole 540*a*. The blind holes 540*a* and 540*b* have a diameter of about 0.11 inch, a depth of at least 0.2 inch, a 45° chamfer of about 0.02 inch wide on an entrance edge, and a fillet with a radius of at most 0.02 inch on a bottom corner.

The mounting surface 120*b* also includes threaded sockets arranged in a first circular row and a second circular row which divide the mounting surface 120*b* into a central portion, a middle portion and an outer portion. The first circular row is preferably located on a radius of ¼ to ½ the radius of the inner electrode 120, further preferably at a radial distance of about 2.4-2.6 inches from the center of the inner electrode 120; the second circular row is preferably located on a radius greater than ½ the radius of the inner electrode 120, further preferably at a radial distance of about 5.3-5.5 inches from the center of the inner electrode 120. In a preferred embodiment, a first row of eight 7/16-28 (Unified Thread Standard) threaded sockets 520*a*, each of which configured to receive a stud/socket assembly 303, are circumferentially spaced apart on a radius between 2.49 and 2.51 inches from the center of the inner electrode 120 and azimuthally offset by about 45° between each pair of adjacent threaded sockets 520*a*. Each of the threaded sockets 520*a* has a total depth of about 0.2 inch, a threaded depth of at least 0.163 inch from the entrance edge, and a 45° chamfer of about 0.03 inch wide on an entrance edge. One of the threaded sockets 520*a* is azimuthally aligned with the blind hole 540*a*. A second row of eight 7/16-28 (Unified Thread Standard) threaded sockets 520*b*, each of which configured to receive a stud/socket assembly 303, are circumferentially spaced apart on a radius between 5.40 and 5.42 inches from the center of the inner electrode 120 and azimuthally offset by about 45° between each pair of adjacent threaded holes 520*b*. Each of the threaded sockets 520*b* and 520*a* has a total depth of about 0.2 inch, a threaded depth of at least 0.163 inch from the entrance edge, and a 45° chamfer of about 0.03 inch wide on an entrance edge. One of the holes 520*b* is azimuthally aligned with the blind hole 540*a*.

The mounting surface 120*b* further includes first, second and third smooth (unthreaded) blind holes configured to receive receipt of alignment pins (530*a*, 530*b* and 530*c*, respectively, or 530 collectively) (details shown in FIG. 5G) radially aligned at a radius between 6.02 and 6.03 inches from the center of the inner electrode 120. "Radially aligned" means the distances to the center are equal. The holes 530*a* have a diameter between 0.11 and 0.12 inch, a depth of at least 0.1 inch, a 45° chamfer of about 0.02 inch wide on an entrance edge, and a fillet with a radius of at most 0.02 inch on a bottom corner. The first hole 530*a* is offset by about 10° clockwise azimuthally from the blind holes 540*a*; the second hole 530*b* is offset by about 92.5° counterclockwise azimuthally from the first hole 530*a*; the third hole 530*c* is offset by about 190° counterclockwise azimuthally from the first hole 530*a*.

Referring to FIG. 1A, the inner electrode 120 is fastened to the backing plate 140 by a plurality of (e.g. eight) cam locks 152 engaging the threaded sockets 520*a* and by a plurality of (e.g. eight) cam locks 151 engaging the threaded sockets 520*b* in the upper surface 120*b*.

The cam locks 151 and 152 provide points of mechanical support, improve thermal contact with the backing plate 140, reduce warping of the inner electrode 120, and hence reduce processing rate non-uniformity and thermal non-uniformity.

Figure 6A:
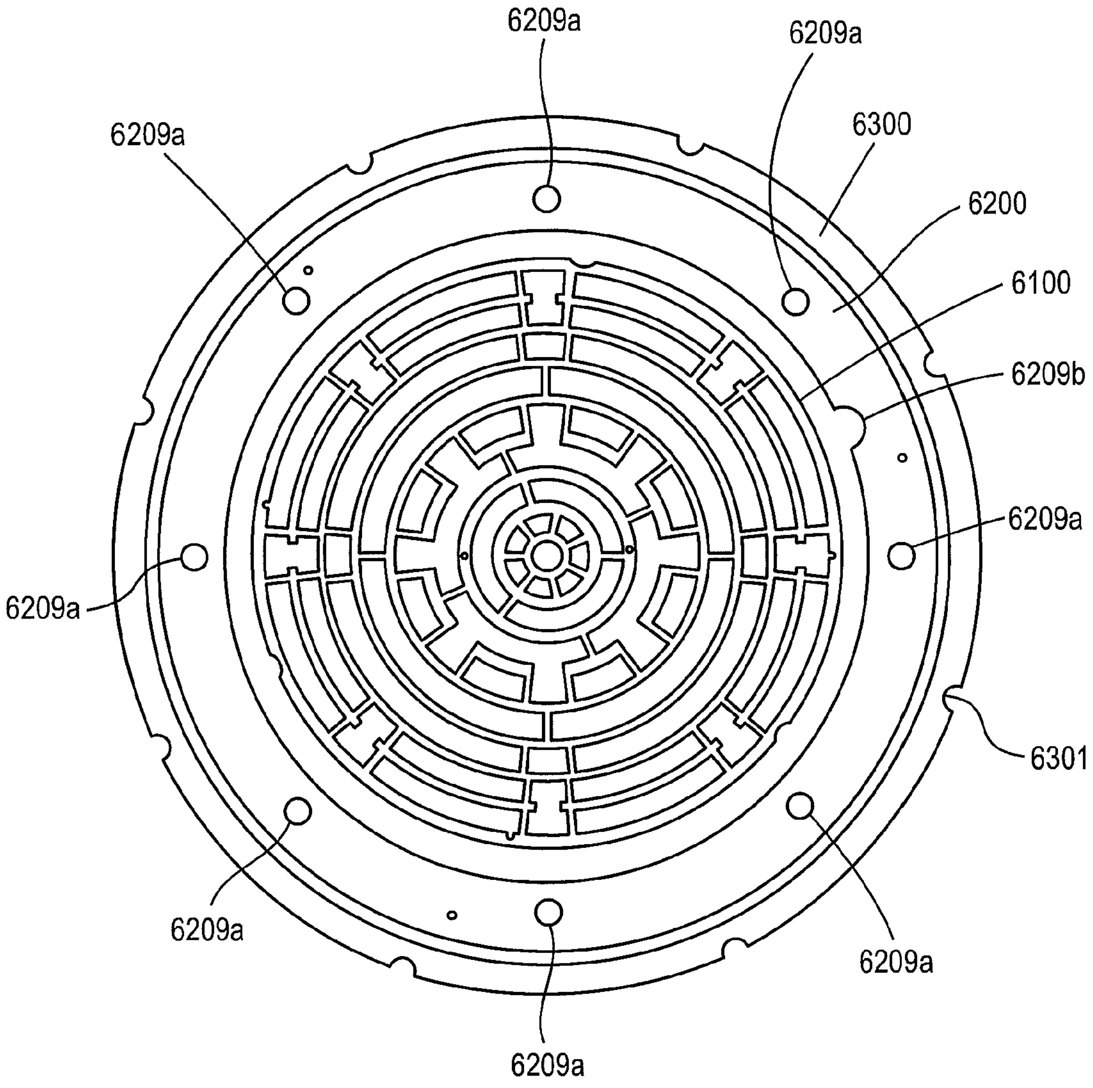
FIG. 6A is a top view of an inner gasket, a first annular gasket and a second annular gasket.

FIG. 6A shows a top view of a thermally and electrically conductive gasket set. This gasket set comprises an inner gasket 6100 comprising a plurality of concentric rings connected by a plurality of spokes, a first annular gasket 6200 with a plurality of holes and one cutout, and a second annular gasket 6300 with a plurality of cutouts. The gaskets are preferably electrically and thermally conductive and made of a material without excessive outgas in a vacuum environment, e.g., about 10 to 200 mTorr, having low particle generation, being compliant to accommodate shear at contact points, and free of metallic components that are lifetime killers in semiconductor substrates such as Ag, Ni, Cu and the like. The gaskets can be a silicone-aluminum foil sandwich gasket structure or an elastomer-stainless steel sandwich gasket structure. The gaskets can be an aluminum sheet coated on upper and lower sides with a thermally and electrically conductive rubber compatible in a vacuum environment used in semiconductor manufacturing wherein steps such as plasma etching are carried out. The gaskets are preferably compliant such that they can be compressed when the electrode and backing plate are mechanically clamped together but prevent opposed surfaces of the electrode and backing plate from rubbing against each other during temperature cycling of the showerhead electrode. The gaskets can be manufactured of a suitable material such as "Q-PAD II" available from the Bergquist Company. The thickness of the gaskets is preferably about 0.006 inch. The various features of the gaskets can be knife-cut, stamped, punched, or preferably laser-cut from a continuous sheet. The gasket set is mounted between the inner electrode 120, outer electrodes 130 and annular shroud 190, and the backing plate 140 to provide electrical and thermal contact therebetween.

Figure 6B:
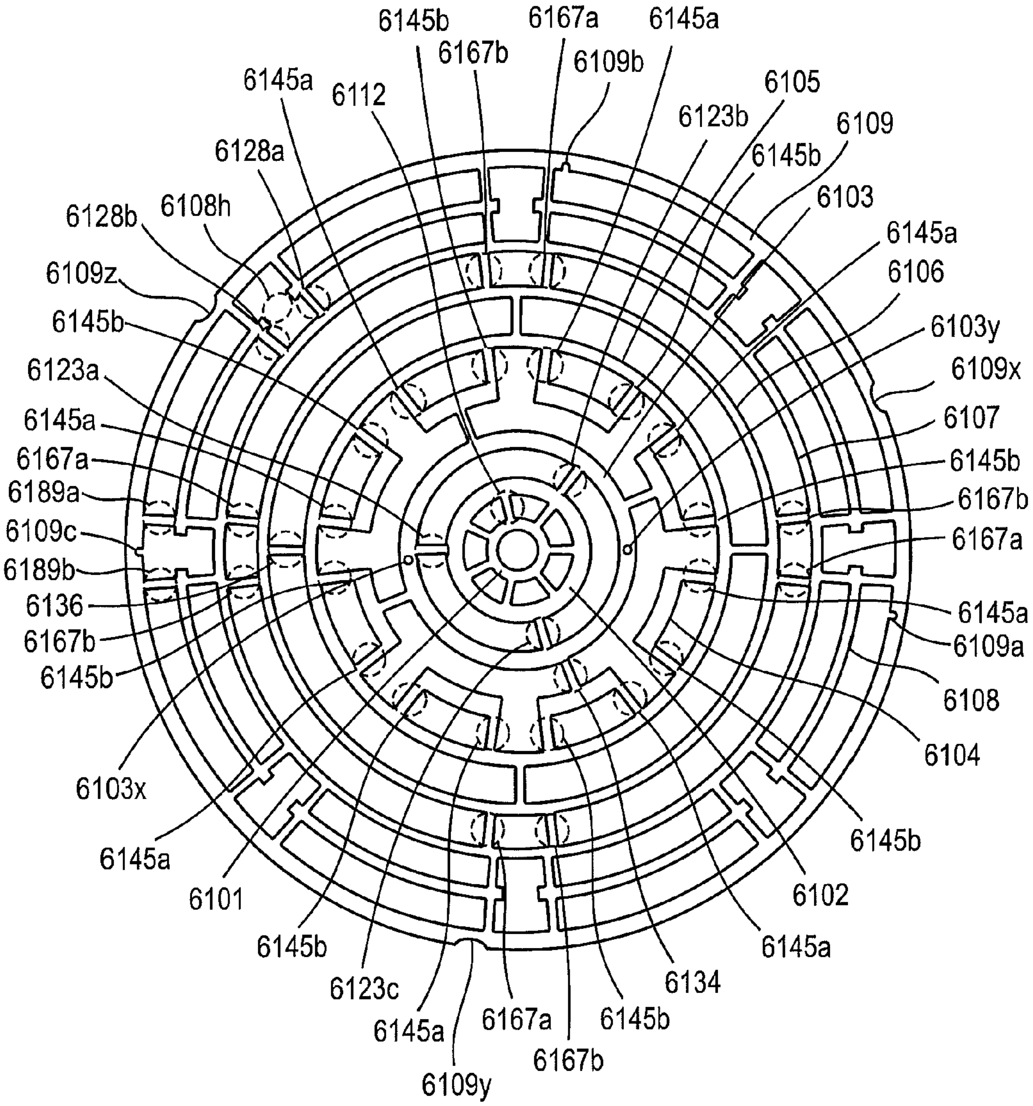
FIG. 6B is an enlarged view of the inner gasket in FIG. 6A.

FIG. 6B shows the details of the inner gasket 6100. The inner gasket 6100 preferably comprises nine concentric rings interconnected by radial spokes. A first ring 6101 has an inner diameter of at least 0.44 inch (e.g. between 0.60 and 0.65 inch) and an outer diameter of at most 1.35 inches (e.g. between 0.95 and 1.00 inch). The first ring 6101 is connected to a second ring 6102 by seven radially extending and azimuthally evenly spaced spokes 6112. Each spoke 6112 has a width of about 0.125 inch.

The second ring 6102 has an inner diameter of at least 1.35 inches (e.g. between 1.72 and 1.78 inches) and an outer diameter of at most 2.68 inches (e.g. between 2.25 and 2.35 inches). The second ring 6102 is connected to a third ring 6103 by three radially extending and azimuthally evenly spaced spokes 6123*a*, 6123*b* and 6123*c*, each of which has a width of about 0.125 inch. One spoke 6123*a* is offset azimuthally from one of the spokes 6112 by about 180°.

The third ring 6103 has an inner diameter of at least 2.68 inches (e.g. between 3.15 and 3.20 inches) and an outer diameter of at most 4.23 inches (e.g. between 3.70 and 3.75 inches). The third ring is connected to a fourth ring 6104 by four radially extending and azimuthally evenly spaced spokes 6134. Each spoke has a width of about 0.125 inch. One of the spokes 6134 is offset azimuthally by about 22.5° counterclockwise from the spoke 6123*a*. The third ring 6103 also includes two round holes 6103*x* and 6103*y* located at a radial distance between 1.70 and 1.75 inches from the center of the inner gasket 6100. The round holes 6103*x* and 6103*y* have a diameter of about 0.125 inch. The round hole 6103*x* is offset azimuthally by about 5° counterclockwise from the spoke 6123*a*. The round hole 6103*y* is offset azimuthally by about 180° from the spoke 6123*a*. The round holes 6103*x* and 6103*y* are configured to receive alignment pins.

The fourth ring 6104 has an inner diameter of at least 4.23 inches (e.g. between 4.68 and 4.73 inches) and an outer diameter of at most 5.79 inches (e.g. between 5.27 and 5.32 inches). The fourth ring 6104 is connected to a fifth ring 6105 by a set of 8 radially extending and azimuthally evenly spaced spokes 6145*a* and another set of 8 radially extending and azimuthally evenly spaced spokes 6145*b*. One of the spokes 6145*b* is offset azimuthally by about 8.5° counterclockwise from the spoke 6123*a*. One of the spokes 6145*a* is offset azimuthally by about 8.5° clockwise from the spoke 6123*a*. Each spoke 6145*a* and 6145*b* has a width of about 0.125 inch. The spokes 6145*a* and 6145*b* extend inward radially and separate the fourth ring 6104 into eight arcuate sections each of which has a central angle of about 28°.

The fifth ring 6105 has an inner diameter of at least 5.79 inches (e.g. between 6.33 and 6.38 inches) and an outer diameter of at most 7.34 inches (e.g. between 6.71 and 6.76 inches). The fifth ring 6105 is connected to a sixth ring 6106 by four radially extending and azimuthally evenly spaced spokes 6156. One of the spokes 6156 is offset azimuthally by about 90° from the spoke 6123*a*. Each the spokes 6156 has a width of about 0.125 inch.

The sixth ring 6106 has an inner diameter of at least 7.34 inches (e.g. between 7.90 and 7.95 inches) and an outer diameter of at most 8.89 inches (e.g. between 8.23 and 8.28 inches). The sixth ring 6106 is connected to a seventh ring 6107 by a set of four radially extending and azimuthally evenly spaced spokes 6167*a* and another set of four radially extending and azimuthally evenly spaced spokes 6167*b*. One of the spokes 6167*b* is offset azimuthally by about 6.4° counterclockwise from the spoke 6123*a*. One of the spokes 6167*a* is offset azimuthally by about 6.4° clockwise from the spoke 6123*a*. Each spoke 6167*a* and 6167*b* has a width of about 0.125 inch.

The seventh ring 6107 has an inner diameter of at least 8.89 inches (e.g. between 9.32 and 9.37 inches) and an outer diameter of at most 10.18 inches (e.g. between 9.65 and 9.70 inches). The seventh ring 6107 is connected to an eighth ring 6108 by a set of eight radially extending and azimuthally evenly spaced spokes 6178*a* and another set of eight radially extending and azimuthally evenly spaced spokes 6178*b*. One of the spokes 6178*b* is offset azimuthally by about 5° counterclockwise from the spoke 6123*a*. One of the spokes 6167*a* is offset azimuthally by about 5° clockwise from the spoke 6123*a*. Each spoke 6167*a* and 6167*b* has a width of about 0.125 inch.

The eighth ring 6108 has an inner diameter of at least 10.18 inches (e.g. between 10.59 and 10.64 inches) and an outer diameter of at most 11.46 inches (e.g. between 10.95 and 11.00 inches). The eighth ring 6108 is connected to a ninth ring 6109 by a set of eight radially extending and azimuthally evenly spaced spokes 6189*a* and another set of eight radially extending and azimuthally evenly spaced spokes 6189*b*. One of the spokes 6189*b* is offset azimuthally by about 5° counterclockwise from the spoke 6123*a*. One of the spokes 6189*a* is offset azimuthally by about 5° clockwise from the spoke 6123*a*. Each spoke 6167*a* and 6167*b* has a width of about 0.125 inch. Eight arcuate cutouts 6108*h* with a central angle of about 6° inch separate the eighth ring 6108 into eight sections. The cutouts 6108*h* are azimuthally equally spaced. One of the cutout 6108*h* is azimuthally aligned with the spoke 6123*a*.

The ninth ring 6109 has an inner diameter between 11.92 and 11.97 inches and an outer diameter between 12.45 and 12.50 inches. The ninth ring 6109 has three small-diameter cutouts 6109*a*, 6109*b* and 6109*c* on its inner perimeter. The cutouts 6109*b* and 6109*c* are azimuthally offset from the cutout 6109*a* by about 92.5° counterclockwise and about 190° counterclockwise, respectively. The cutout 6109*c* is azimuthally aligned with the spoke 6123*a*. The centers of the cutouts 6109*a*, 6109*b* and 6109*c* are located at a radial distance of about 6.02 inches from the center of the inner gasket 6100. The cutouts 6109*a*, 6109*b* and 6109*c* face inward and include a semi-circular outer periphery with a diameter of about 0.125 inch and include an inner opening with straight radial edges. The ninth ring 6109 also has three large-diameter round and outwardly facing cutouts 6109*x*, 6109*y* and 6109*z* on its outer perimeter. The cutouts 6109*x*, 6109*y* and 6109*z* are azimuthally equally spaced and have a diameter of about 0.72 inch. Their centers are located at a radial distance of about 6.48 inches from the center of the inner gasket 6100. The cutout 6109*z* is azimuthally offset from the spoke 6123*a* by about 37.5° clockwise.

The first annular gasket 6200 has an inner diameter of about 14.06 inches and an outer diameter of about 16.75 inches. The first annular gasket 6200 has eight circular holes 6209*a* equally spaced azimuthally. The centers of the holes 6209*a* are located at a radial distance of about 7.61 inches from the center of the first annular gasket 6200. The holes 6209*a* have a diameter of about 0.55 inch. When installed in the showerhead electrode assembly 100 (as described in details hereinbelow), one of the holes 6209*a* is azimuthally aligned with spoke 6123*a* of the inner gasket 6100. The first annular gasket 6200 also has one round inwardly facing cutout 6209*b* on the inner perimeter of the first annular gasket 6200. The center of this cutout 6209*b* is located at a distance of about 6.98 inches from the center of the first annular gasket 6200. The cutout 6209*b* has a diameter of about 0.92 inch. When installed in the showerhead electrode assembly 100 (as described in details hereinbelow), the cutout 6209*b* is azimuthally offset from the spoke 6123*a* by about 202.5° counterclockwise. The first annular gasket 6200 further has three circular holes 6210, 6220 and 6230 configured to allow tool access. These holes are located at a radial distance of about 7.93 inches and have a diameter of about 0.14 inch. The holes 6210, 6220 and 6230 are offset azimuthally by about 7.5°, about 127.5° and about 252.5° respectively clockwise from the cutout 6209*b*.

The second annular gasket 6300 has an inner diameter of about 17.29 inches and an outer diameter of about 18.69 inches. The second annular gasket 6300 has eight round outwardly facing cutouts 6301 equally spaced azimuthally on the outer perimeter. The centers of the cutouts 6301 are located at a radial distance of about 9.30 inches from the center of the third annular gasket 6300. The cutouts 6301 have a diameter of about 0.53 inch.

When the inner electrode 120 is installed in the chamber 100, an alignment ring, two inner alignment pins and three outer alignment pins are first inserted into the annular groove 550, holes 540*a* and 540*b* and holes 530, respectively. The inner gasket 6100 is then mounted to the inner electrode 120. The holes 6103*x* and 6103*y* correspond to the inner alignment pins; and the center hole of the inner gasket 6100 corresponds to the alignment ring and the center gas injection hole in the inner electrode 120. Openings between the nine rings and in the spokes in the inner gasket 6100 correspond to the first row through the eighth row of gas injection holes in the inner electrode 120. The cutouts 6109*a*, 6109*b* and 6109*c* on the ninth ring correspond to the holes 530*a*, 530*b* and 530*c*, respectively. Eight stud/socket assemblies 303 are threaded into the eight threaded sockets 520*a* and eight stud/socket assemblies 303 are threaded into the eight threaded sockets 520*b* to fasten the inner electrode 120 to the backing plate 140, with the inner gasket 6100 sandwiched therebetween. The stud/socket assemblies 303 support the inner electrode 120 at a location between the center and outer edge, improve thermal contact with the backing plate 140 and reduce warping of the inner electrode 120 caused by temperature cycling during processing of substrates. The inner electrode 120 is fastened against the backing plate 140 by rotating the cam shafts 150. Eight stud/socket assemblies 303 are threaded into eight threaded sockets in the outer electrode 130. The first annular gasket 6200 is placed on the outer electrode 130. Eight stud/socket assemblies 303 are threaded into eight threaded sockets in the annular shroud 190. The second annular gasket 6300 is placed on the annular shroud 190. The outer electrode 130 and the annular shroud 190 are fastened to the backing plate 140 by rotating the cam shafts 160. The eight holes 6209*a* correspond to the eight stud/socket assemblies 303 threaded on the outer electrode 130. The cutouts 6301 correspond to the eight stud/socket assemblies 303 threaded on the shroud 190.

The rings 6101-6109 and the spokes in the inner gasket 6100 may be arranged in any suitable pattern as long as they do not obstruct the gas injection holes 106, the cam locks 151 and 152, alignment ring, or alignment pins in the inner electrode 120.

While the showerhead electrode assembly, showerhead electrode, outer electrode, gasket set and gas hole pattern have been described in detail with reference to specific embodiments thereof, it will be apparent to those skilled in the art that various changes and modifications can be made, and equivalents employed, without departing from the scope of the appended claims.

We claim:

1. A showerhead electrode for a showerhead electrode assembly in a parallel plate capacitively coupled plasma processing chamber, the showerhead electrode assembly comprising a backing plate having gas injection holes extending between upper and lower faces thereof, a plurality of stud/socket assemblies and cam shafts, an alignment ring, and a plurality of alignment pins; the showerhead electrode comprising:

a plasma exposed surface on a lower face thereof;

a mounting surface on an upper face thereof;

a plurality of gas injection holes extending between the plasma exposed surface and the mounting surface thereof and arranged in a pattern matching the gas injection holes in the backing plate;

wherein the gas injection holes have a diameter less than or equal to 0.04 inch and are arranged in a pattern with one center gas injection hole at a center of the electrode and eight concentric rows of gas injection holes, the first row having seven gas injection holes located at a radial distance of about 0.6-0.7 inch from the center of the electrode;

the second row having seventeen gas injection holes located at a radial distance of about 1.3-1.4 inches from the center of the electrode;

the third row having twenty-eight gas injection holes located at a radial distance of about 2.1-2.2 inches from the center of the electrode;

the fourth row having forty gas injection holes located at a radial distance of about 2.8-3.0 inches from the center of the electrode;

the fifth row having forty-eight gas injection holes located at a radial distance of about 3.6-3.7 inches from the center of the electrode;

the sixth row having fifty-six gas injection holes located at a radial distance of about 4.4-4.5 inches from the center of the electrode;

the seventh row having sixty-four gas injection holes located at a radial distance of about 5.0-5.1 inches from the center of the electrode;

the eighth row having seventy-two gas injection holes located at a radial distance of about 5.7-5.8 inches from the center of the electrode;

the gas injection holes in each row are azimuthally equally spaced.

2. The showerhead electrode of claim 1, wherein the showerhead electrode is an inner electrode of a showerhead electrode assembly comprising an outer electrode having an inner flange and threaded sockets configured to receive stud/socket assemblies which engage openings in the lower face of the backing plate, an annular shroud having a plurality of threaded sockets configured to receive stud/socket assemblies which engage openings in the lower face of the backing plate, the inner electrode comprising:

a single annular step on an outer periphery thereof, the single annular step configured to mate with the inner flange of the outer electrode;

a plurality of unthreaded blind holes in the mounting surface configured to receive the alignment pins;

an annular groove in the mounting surface configured to receive the alignment ring; and a plurality of threaded sockets in the mounting surface configured to receive the stud/socket assemblies which engage the cam shafts and attach the inner electrode to the backing plate without using a clamp ring.

3. The showerhead electrode of claim 2, wherein the plurality of threaded sockets comprise a first circular row of eight equally spaced threaded sockets and a second circular row of eight equally spaced threaded sockets; each of the threaded sockets threaded to a thread size of 7⁄16-28 and having a threaded depth of at least 0.163 inch; the first circular row located at a radial distance of about 2.4-2.6 inches from the center of the inner electrode; the second circular row located at a radial distance of about 5.3-5.5 inches from the center of the inner electrode.

4. The showerhead electrode of claim 2, wherein the threaded sockets comprise eight threaded sockets in a first circular row located on a radius of ¼ to ½ the radius of the inner electrode and eight threaded sockets in a second circular row located on a radius greater than ½ the radius of the inner electrode.

5. The showerhead electrode of claim 2, wherein the plurality of unthreaded blind holes configured to receive the alignment pins comprises a first set of holes and a second set of holes;

the first set of holes comprising two holes: (a) located at a radial distance of about 1.7-1.8 inches from the center of the inner electrode; (b) azimuthally offset by about 175° from each other; (c) having a diameter of about 0.10-0.12 inch; and (d) having a depth of at least 0.2 inch;

the second set of holes comprising a first hole, a second hole and a third hole: (a) located at a radial distance of about 6.0-6.1 inches from the center of the inner electrode; (b) the first hole azimuthally offset by about 10° clockwise from one hole in the first set; (c) the second and third holes azimuthally offset by about 92.5° and about 190° counterclockwise from the first hole; (d) having a diameter of about 0.11-0.12 inch; and (e) having a depth of at least 0.1 inch.

6. The showerhead electrode of claim 2, wherein:

the inner electrode is a planar disk having a uniform thickness of about 0.4 inch and a diameter about 12.5 inches; the annular step has an inner diameter of about 12.0 inches and a vertical surface about 0.2 inch long; the annular groove has an outer diameter of about 0.44 inch, an inner diameter of about 0.24 inch and a depth of at least 0.1 inch; the inner electrode is manufactured from a plate of single crystal silicon or polycrystalline silicon with a resistivity between 0.005 and 0.020 Ohm-cm and a total heavy metal contamination less than 10 parts per million.

7. A showerhead electrode assembly comprising the inner electrode of claim 2, further comprising:

a stud/socket assembly threaded into each threaded socket of the inner electrode; and a backing plate having bores with cam shafts mounted therein;

wherein the showerhead electrode is fastened to the backing plate solely by the stud/socket assemblies engaged with the cam shafts.

8. The showerhead electrode assembly of claim 7, wherein two of the stud/socket assemblies threaded in the threaded sockets of the showerhead electrode engage with a single cam shaft.

9. A showerhead electrode assembly comprising the inner electrode of claim 2, further comprising:

a stud/socket assembly threaded into each threaded socket of the outer electrode, the outer electrode including an outer flange and the inner flange, the inner flange overlying the annular step of the inner electrode; and a stud/socket assembly threaded into each threaded socket of the annular shroud, the annular shroud having an inner flange overlying the outer flange of the outer electrode;

wherein the outer electrode and the annular shroud are fastened to the backing plate by the stud/socket assemblies engaged with the cam shafts.

10. The showerhead electrode assembly of claim 9, wherein a stud/socket assembly threaded in a threaded socket of the outer electrode and a stud/socket assembly threaded in a threaded socket of the annular shroud engage with a single cam shaft.

11. A method of assembling the showerhead electrode assembly of claim 9, comprising:

inserting an alignment ring into the annular groove on the mounting surface of the inner electrode;

inserting alignment pins into the plurality of unthreaded blind holes on the mounting surface of the inner electrode;

mounting an inner gasket on the mounting surface of the inner electrode;

fastening the inner electrode with the inner gasket mounted thereon to the backing plate with cam locks;

placing a first annular gasket on the upper surface of the outer electrode;

placing a second annular gasket on the annular shroud;

fastening the outer electrode with the first annular gasket mounted thereon and the annular shroud with the second annular gasket mounted thereon to the backing plate with cam locks.

12. A thermally and electrically conductive gasket of a gasket set configured to be mounted in a showerhead electrode assembly of claim 7;

the gasket set consisting of:

an inner gasket configured to be mounted on the inner electrode, comprising a plurality of concentric flat rings connected by a plurality of spokes;

a first annular gasket configured to surround and be concentric with the inner gasket and be mounted on the outer electrode, comprising a flat annular ring having a plurality cutouts;

a second annular gasket configured to surround and be concentric with the first annular gasket and be mounted on the annular shroud, comprising a flat annular ring having a plurality cutouts;

wherein the gasket accommodates the gas injection holes, the alignment pin holes, the alignment ring groove and/or the threaded sockets.

13. The gasket of claim 12, wherein the concentric flat rings in the inner gasket are continuous or segmented.

14. The gasket of claim 12, wherein the inner gasket comprises at least six concentric flat rings having a thickness of about 0.006 inch and a width of at least 0.1 inch, wherein the first ring has an inner diameter of at least 0.44 inch and an outer diameter of at most 1.35 inches; the second ring has an inner diameter of at least 1.35 inches and an outer diameter of at most 2.68 inches; the third ring has an inner diameter of at least 2.68 inches and an outer diameter of at most 4.23 inches; the fourth ring has an inner diameter of at least 4.23 inches and an outer diameter of at most 5.79 inches; the fifth ring has an inner diameter of at least 5.79 inches and an outer diameter of at most 7.34 inches; the sixth ring has an inner diameter of at least 7.34 inches and an outer diameter of at most 8.89 inches.

15. The gasket of claim 14, wherein the inner gasket comprises nine concentric flat rings, wherein the seventh ring has an inner diameter of at least 8.89 inches and an outer diameter of at most 10.18 inches; the eighth ring has an inner diameter of at least 10.18 inches and an outer diameter of at most 11.46 inches; the ninth ring has an inner diameter between 11.92 and 11.97 inches and an outer diameter between 12.45 and 12.50 inches.

16. The gasket of claim 12, wherein:

(a) the first annular gasket has one cutout on an inner perimeter and a first set of eight holes configured to accommodate stud/socket assemblies and a second set of three holes configured to allow tool access wherein the diameter of the holes in the first set is larger than the diameter of the holes in the second set; and (b) the second annular gasket has eight cutouts on an outer perimeter configured to accommodate stud/socket assemblies and no cutouts on an inner perimeter.

17. The gasket of claim 12, wherein:

(a) the first annular gasket has a thickness of about 0.006 inch, a width of about 1.3 inch, an inner diameter of about 14.06 inches and an outer diameter of about 16.75 inches; and (b) the second annular gasket has a thickness of about 0.006 inch, a width of about 0.7 inch, an inner diameter of 17.29 inches and an outer diameter of about 18.69 inches.

* * * * *